US011624785B2

(12) United States Patent
Imade

(10) Patent No.: US 11,624,785 B2
(45) Date of Patent: Apr. 11, 2023

(54) BATTERY SYSTEM

(71) Applicant: TOYOTA JIDOSHA KABUSHIKI KAISHA, Toyota (JP)

(72) Inventor: Yuki Imade, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 25 days.

(21) Appl. No.: 17/327,879

(22) Filed: May 24, 2021

(65) Prior Publication Data

US 2021/0382119 A1 Dec. 9, 2021

(30) Foreign Application Priority Data

Jun. 3, 2020 (JP) .............................. JP2020-096973

(51) Int. Cl.
*G01R 31/388* (2019.01)
*G01R 31/3842* (2019.01)
*B60L 58/12* (2019.01)
*H01M 10/48* (2006.01)
*H01M 10/42* (2006.01)

(52) U.S. Cl.
CPC ............ *G01R 31/388* (2019.01); *B60L 58/12* (2019.02); *G01R 31/3842* (2019.01); *H01M 10/4207* (2013.01); *H01M 10/482* (2013.01); *H01M 10/486* (2013.01)

(58) Field of Classification Search
CPC ... G01R 31/388; G01R 31/3842; B60L 58/12; H01M 10/4207; H01M 10/482; H01M 10/486
See application file for complete search history.

(56) References Cited

U.S. PATENT DOCUMENTS

| 2017/0253140 A1* | 9/2017 | Chang ..................... B60L 50/66 |
| 2019/0221898 A1 | 7/2019 | Machida et al. |
| 2020/0233037 A1* | 7/2020 | Yamamoto ........... G01R 31/392 |

FOREIGN PATENT DOCUMENTS

| JP | 2018137171 A | | 8/2018 |
| JP | 2018152269 A | | 9/2018 |
| JP | 2019124567 A | | 7/2019 |
| JP | 2019161781 A | * | 9/2019 |
| JP | 2019187027 A | * | 10/2019 |

* cited by examiner

*Primary Examiner* — Daniel R Miller
(74) *Attorney, Agent, or Firm* — Dickinson Wright, PLLC

(57) ABSTRACT

An ECU performs processing including obtaining a current in a battery assembly, calculating a current in each battery, calculating an SOC of each battery, calculating an OCV of each battery, calculating ΔOCV, calculating an average value Ave of ΔOCVs, carrying out current restriction control when the average value Ave exceeds a first range and exceeds a second range, providing a warning signal when the average value Ave does not exceed the second range, and carrying out normal current control when the average value Ave does not exceed the first range.

5 Claims, 9 Drawing Sheets

BATTERY SYSTEM

This nonprovisional application is based on Japanese Patent Application No. 2020-096973 filed with the Japan Patent Office on Jun. 3, 2020, the entire contents of which are hereby incorporated by reference.

BACKGROUND

Field

The present disclosure relates to a battery system including a plurality of secondary batteries connected in parallel.

Description of the Background Art

For example, a battery system configured with secondary batteries connected in parallel has been known as a battery system to be mounted on a vehicle and the like. In the battery system configured as such, a temperature or a current is varied among secondary batteries connected in parallel. Therefore, appropriate battery protection control in consideration of such variation is demanded.

For example, Japanese Patent Laying-Open No. 2019-124567 discloses a technique for estimating a degree of variation in current among a plurality of secondary batteries connected in parallel, as below. Specifically, a temperature index that correlates with a temperature is calculated in consideration of heat generation and cooling for each of a highest-temperature battery and a lowest-temperature battery of the plurality of secondary batteries connected in parallel. Then, a degree of variation in temperature between the plurality of batteries is set by subtracting the temperature index of the lowest-temperature battery from the temperature index of the highest temperature battery, and the degree in variation in current between the plurality of batteries is estimated based on the set degree of variation in temperature. Then, as a maximum current is set in accordance with the estimated variation in current, the currents that flow through the plurality of batteries are restricted.

SUMMARY

When continuous discharging as in continued high-speed travel on a highway and continuous charging as in plug-in charging are repeated in a vehicle incorporating the battery system in which the plurality of secondary batteries are connected in parallel as described above, however, the current may not be restricted even though a battery relatively high in internal resistance among the plurality of secondary batteries generates heat. This is because, in the battery system in which the plurality of secondary batteries are connected in parallel, at the time of start of charging and discharging, the current is temporarily concentrated to a battery relatively high in internal resistance whereas a current difference is eliminated as charging or discharging continues for a long time. Therefore, a state of heat generation by the battery relatively high in internal resistance continues and deterioration of the battery may be accelerated.

An object of the present disclosure is to provide a battery system capable of suppressing deterioration of a plurality of secondary batteries connected in parallel.

A battery system according to one aspect of the present disclosure includes a plurality of secondary batteries connected in parallel and a controller that controls currents that flow through the plurality of secondary batteries based on an open circuit voltage of each of the plurality of secondary batteries. The controller calculates a difference between a maximum value and a minimum value of open circuit voltages of the plurality of secondary batteries. When an index value obtained based on the calculated difference is large, the controller restricts the currents that flow through the plurality of secondary batteries as compared with when the index value is small.

Thus, as the difference between the maximum value and the minimum value of the open circuit voltages is larger, the current difference among the plurality of secondary batteries is eliminated. Therefore, when the index value obtained based on the difference is large, by restricting the currents that flow through the plurality of secondary batteries as compared with when the index value is small, heat generation by the battery relatively high in internal resistance among the plurality of secondary batteries which results in a temperature of the battery at which deterioration of the battery is accelerated can be suppressed.

In one embodiment, the controller obtains as the index value, an average value calculated based on records of the difference.

Thus, as the average value is larger, the current difference among the plurality of secondary batteries is eliminated. Therefore, by restricting the currents that flow through the plurality of secondary batteries when the average value is large as compared with when the average value is small, heat generation by the battery relatively high in internal resistance among the plurality of secondary batteries which results in a temperature of the battery at which deterioration of the battery is accelerated can be suppressed.

Furthermore, in one embodiment, the controller controls a maximum value of magnitude of the currents that flow through the plurality of secondary batteries when the index value is larger than a threshold value to be smaller than when the index value is smaller than the threshold value.

Thus, when the index value is larger than the threshold value, the maximum value of the currents that flow through the plurality of secondary batteries is decreased. Therefore, heat generation by the battery relatively high in internal resistance among the plurality of secondary batteries which results in a temperature of the battery at which deterioration of the battery is accelerated can be suppressed.

Furthermore, in one embodiment, the battery system further includes a voltage detector that detects voltages of the plurality of secondary batteries and a current detector that detects the currents that flow through the plurality of secondary batteries. The controller obtains voltages in an unloaded state of the plurality of secondary batteries with the voltage detector. The controller estimates an initial value of a charged state of each of the plurality of secondary batteries based on the obtained voltage. The controller estimates the charged state of each of the plurality of secondary batteries based on the initial value of the charged state, the currents detected by the current detector, and a battery capacity of each of the plurality of secondary batteries. The controller calculates the open circuit voltage of each of the plurality of secondary batteries based on the estimated charged state of each of the plurality of secondary batteries.

Thus, since the open circuit voltage of each of the plurality of secondary batteries can highly accurately be calculated, the currents that flow through the plurality of secondary batteries can appropriately be restricted based on the index value obtained based on the open circuit voltage of each of the plurality of secondary batteries. Therefore, heat generation by the battery relatively high in internal resistance among the plurality of secondary batteries which results in a temperature of the battery at which deterioration of the battery is accelerated can be suppressed.

Furthermore, in one embodiment, the battery system further includes a notification apparatus that gives predetermined information. When the index value is larger than a threshold value, the controller gives information indicating that the battery system is abnormal through the notification apparatus.

Thus, a user can recognize that the battery system is abnormal.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
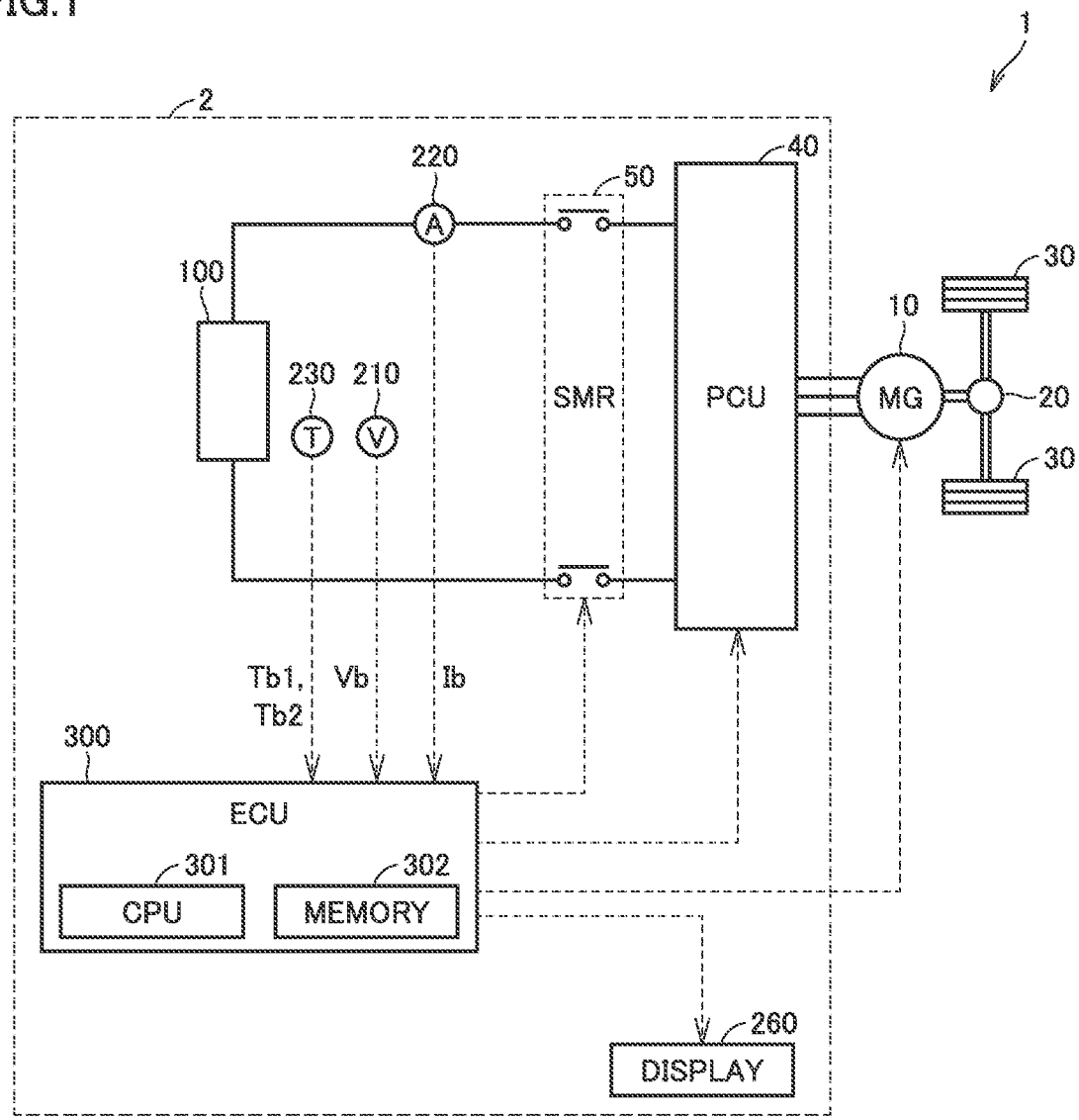
FIG. 1 is a block diagram showing an exemplary overall configuration of a vehicle incorporating a battery system according to the present embodiment.

An embodiment of the present disclosure will be described in detail below with reference to the drawings. The same or corresponding elements in the drawings have the same reference characters allotted and description thereof will not be repeated.

An example in which a battery system according to this embodiment is mounted on an electric vehicle will be described below. FIG. 1 is a block diagram showing an exemplary overall configuration of a vehicle 1 incorporating a battery system according to the present embodiment.

Referring to FIG. 1, vehicle 1 includes a battery system 2, a motor generator (which is referred to as an "MG" below) 10, a power transmission gear 20, and a drive wheel 30. Battery system 2 includes a power control unit (which is referred to as a "PCU" below) 40, a system main relay (which is referred to as an "SMR" below) 50, a battery assembly 100, a display 260, and an electronic control unit (ECU) 300.

MG 10 is implemented, for example, by a three-phase alternating-current (AC) rotating electric machine. Output torque from MG 10 is transmitted to drive wheel 30 through power transmission gear 20 including a reduction gear and the like. MG 10 can also generate electric power by rotational force of drive wheel 30 when vehicle 1 performs a regenerative braking operation. Though FIG. 1 shows a configuration in which only a single MG 10 is provided, the number of MGs 10 is not limited to one but a plurality of (for example, two) MGs 10 may be provided.

PCU 40 includes, for example, an inverter and a converter (neither of which is shown). During discharging of battery assembly 100, the converter up-converts a voltage supplied from battery assembly 100 and supplies the resultant voltage to the inverter. The inverter converts direct-current (DC) power supplied from the converter into AC power to drive MG 10. During charging of battery assembly 100, the inverter converts AC power generated by MG 10 into DC power and supplies DC power to the converter. The converter down-converts a voltage supplied from the inverter and supplies the resultant voltage to battery assembly 100.

SMR 50 is electrically connected to a current path that connects battery assembly 100 and PCU 40 to each other. When SMR 50 is closed in response to a control signal from ECU 100, electric power can be supplied and received between battery assembly 100 and PCU 40. When SMR 50 is opened in response to a control signal from ECU 300, battery assembly 100 and PCU 40 are electrically disconnected from each other.

Battery assembly 100 is a rechargeable DC power supply. Battery assembly 100 includes, for example, a plurality of secondary battery cells as power storage elements such as a nickel metal hydride battery or a lithium ion battery (for example, including what is called an all-solid-state battery containing a solid electrolyte and a battery containing a liquid electrolyte). In the present embodiment, battery assembly 100 is configured with a plurality of secondary batteries connected in parallel.

Figure 2:
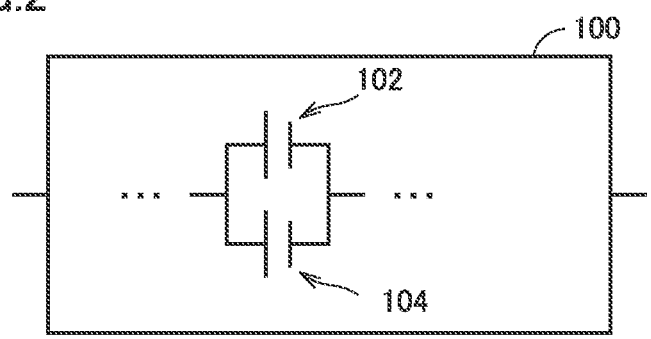
FIG. 2 is a diagram for illustrating an exemplary configuration of a battery assembly in the present embodiment.

FIG. 2 is a diagram for illustrating an exemplary configuration of battery assembly 100 in the present embodiment. As shown in FIG. 2, battery assembly 100 includes, for example, a battery block in which a plurality of secondary batteries 102 and 104 are connected in parallel.

In the present embodiment, secondary battery 102 of secondary batteries 102 and 104 that constitute battery assembly 100 is defined as a high-resistance battery higher in internal resistance than secondary battery 104 and secondary battery 104 is defined as a low-resistance battery.

Display 260 is provided, for example, at a position where it is visually recognizable by a driver who takes a seat in the compartment of vehicle 1. Display 260 is implemented, for example, by a liquid crystal display or an organic electroluminescence (EL) display. Display 260 shows prescribed information in response to a control signal (for example, a warning signal) from ECU 300.

A voltage sensor 210, a current sensor 220, and a battery temperature sensor 230 are connected to ECU 300.

Voltage sensor 210 detects a voltage Vb of battery assembly 100. Current sensor 220 detects a current Ib input to and output from battery assembly 100. Battery temperature sensor 230 detects a temperature Tb1 of secondary battery 102 and a temperature Tb2 of secondary battery 104. Each sensor provides a result of detection to ECU 300.

ECU 300 includes a central processing unit (CPU) 301 and a memory 302. Memory 302 includes a read only memory (ROM), a random access memory (RAM), and a rewritable non-volatile memory. As CPU 301 executes a program stored in memory 302 (for example, the ROM), various types of control are carried out. ECU 300 controls an operation by each device (more specifically, charging and discharging of battery assembly 100) such that vehicle 1 is in a desired state, based on a signal received from each sensor and a map and a program stored in memory 302. Various types of control carried out by ECU 300 can also be carried out by dedicated hardware (electronic circuitry) without being limited to processing by software.

In battery system 2 configured as above, a temperature or a current is varied between secondary batteries 102 and 104 connected in parallel. Therefore, appropriate battery protection control in consideration of such variation is demanded.

Figure 3:
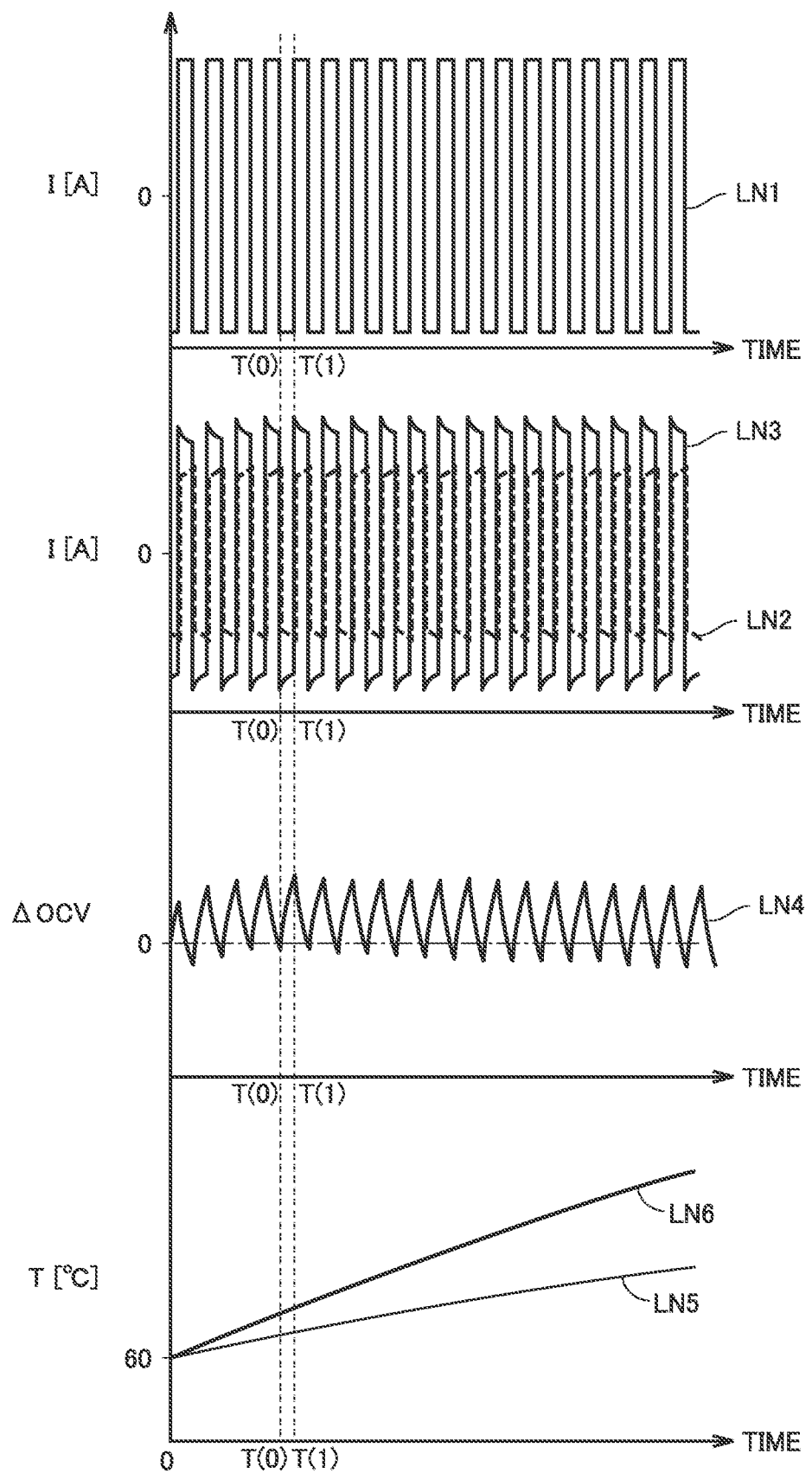
FIG. 3 is a timing chart showing exemplary change in current, ΔOCV, and a battery temperature in repeated short-period charging and discharging.

FIG. 3 is a timing chart showing exemplary change in current, $\Delta OCV$, and battery temperature in repeated short-period charging and discharging. Repeated short-period charging and discharging refers, for example, to a charging and discharging state in which short charging (for example, charging for thirty seconds or shorter) and short discharging (for example, discharging for thirty seconds or shorter) are alternately repeated, and corresponds to a charging and discharging pattern when vehicle 1 travels in an urban area. $\Delta OCV$ represents a difference ($OCV_2-OCV_1$) between an open circuit voltage $OCV_1$ of secondary battery 102 and an open circuit voltage $OCV_2$ of secondary battery 104.

LN1 in FIG. 3 shows change in current that flows through battery assembly 100. LN2 (a dashed line) in FIG. 3 shows change in current that flows through secondary battery 102 (high-resistance battery). LN3 (a solid line) in FIG. 3 shows change in current that flows through secondary battery 104 (low-resistance battery). LN4 in FIG. 3 shows change in $\Delta OCV$. LN5 (a thin line) in FIG. 3 shows change in temperature of secondary battery 102 (high-resistance battery). LN6 (a bold line) in FIG. 3 shows change in temperature of secondary battery 104 (low-resistance battery). An initial value of the temperature of each of secondary batteries 102 and 104 is assumed, for example, as 60° C.

As shown with LN1 in FIG. 3, repeated short-period charging and discharging to and from battery assembly 100 is assumed. As shown with LN2 and LN3 in FIG. 3, during a period from a time point of start of charging (for example, time T(0)) until a time point of switching to discharging (for example, time T(1)), the current is concentrated to the low-resistance battery. Therefore, the current that flows through the low-resistance battery is larger in magnitude than the current that flows through the high-resistance battery.

The current is concentrated to the low-resistance battery also during a period from the time point of start of discharging (for example, time T(1)) until a time point of next switching to charging. Therefore, the current that flows through the low-resistance battery is larger in magnitude than the current that flows through the high-resistance battery.

Since the current is concentrated to the low-resistance battery, during charging of battery assembly 100, an amount of increase from a reference value (for example, under no load) of the OCV of the low-resistance battery is larger than an amount of increase from the reference value of the OCV of the high-resistance battery, and $\Delta OCV$ increases. On the other hand, during discharging from battery assembly 100, $\Delta OCV$ decreases. Therefore, $\Delta OCV$ repeats such change as increase during charging and decrease during discharging as shown with LN4 in FIG. 3.

Since a state that the current is concentrated to the low-resistance battery continues, a state that the temperature of the low-resistance battery (LN6 in FIG. 3) is higher than the temperature of the high-resistance battery (LN5 in FIG. 3) continues, and a temperature difference increases. Consequently, deterioration of the low-resistance battery may be accelerated.

In order to suppress such deterioration of the low-resistance battery, for example, a difference between an integrated value (which is denoted as a first integrated value below) between an amount of heat generation and an amount of heat radiation in secondary battery 102 and an integrated value (which is denoted as a second integrated value below) between an amount of heat generation and an amount of heat radiation in secondary battery 104 is calculated, and the current can be restricted based on the calculated difference between the first integrated value and the second integrated value. The amount of heat generation in the battery is calculated, for example, based on currents that flow through secondary batteries 102 and 104. The amount of heat radiation in the battery is calculated, for example, based on an amount of activation of a cooling apparatus (not shown). A known technique should only be used for calculating the amount of heat generation and the amount of heat radiation, and detailed description thereof is not given here.

Figure 4:
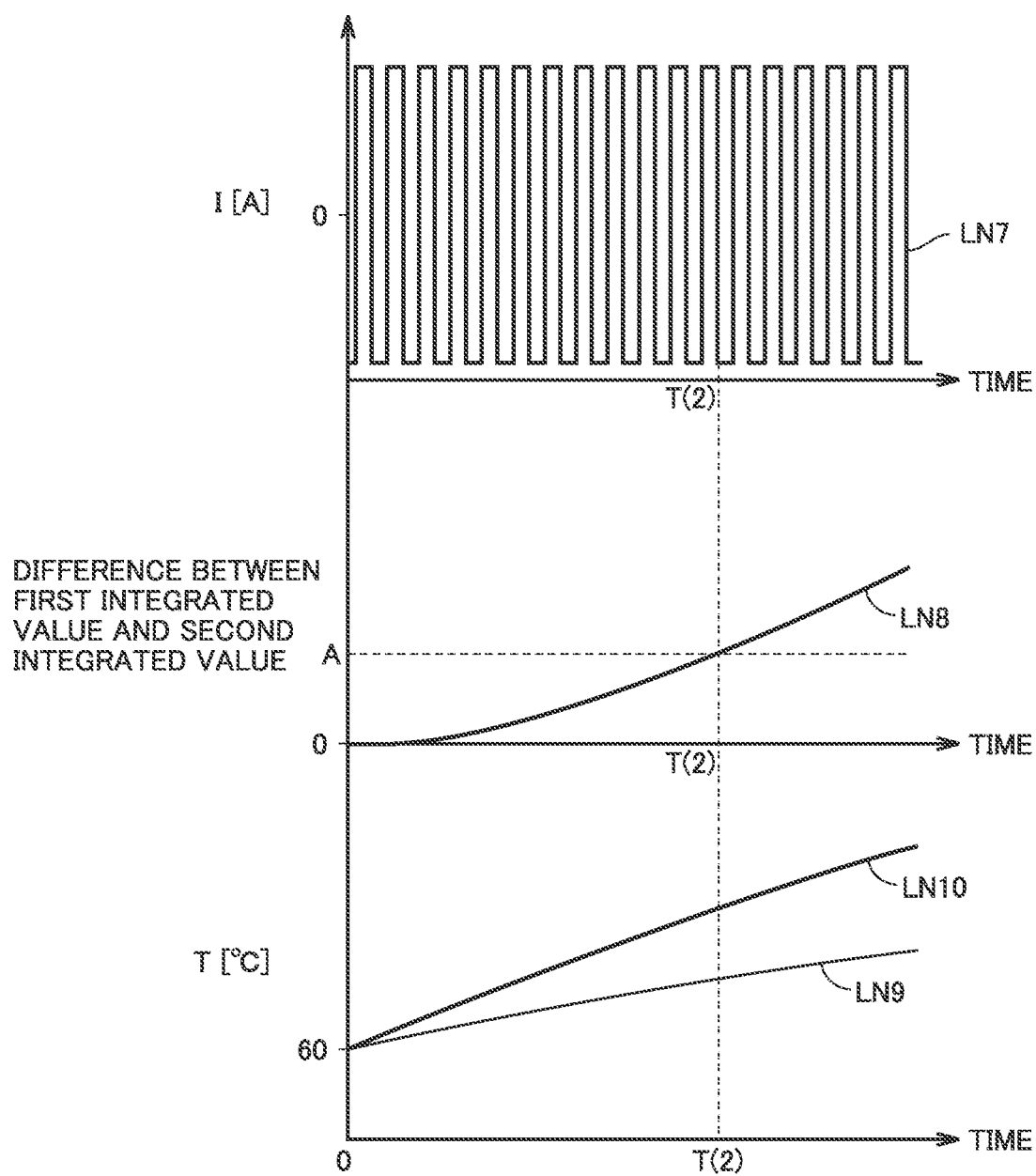
FIG. 4 is a diagram for illustrating change in difference between a first integrated value and a second integrated value in repeated short-period charging and discharging.

FIG. 4 is a diagram for illustrating change in difference between the first integrated value and the second integrated value in repeated short-period charging and discharging. LN7 in FIG. 4 shows change in current that flows through battery assembly 100 and corresponds to change in current shown with LN1 in FIG. 3. LN8 in FIG. 4 shows change in magnitude of the difference between the first integrated value and the second integrated value. LN9 (a thin line) in FIG. 4 shows change in temperature of secondary battery 102 (high-resistance battery) and corresponds to change in temperature shown with LN5 in FIG. 3. LN10 (a bold line) in FIG. 4 shows change in temperature of secondary battery 104 (low-resistance battery) and corresponds to change in temperature shown with LN6 in FIG. 3.

As shown with LN7 in FIG. 4, in repeated short-period charging and discharging to and from battery assembly 100, the current is concentrated to the low-resistance battery as described above. Therefore, a state that the temperature of the low-resistance battery (LN10 in FIG. 4) is higher than the temperature of the high-resistance battery (LN9 in FIG. 4) continues and the temperature difference increases.

Magnitude of the difference between the first integrated value and the second integrated value increases with increase in temperature difference as shown with LN8 in FIG. 4. Therefore, for example, when magnitude of the difference between the first integrated value and the second integrated value is equal to or larger than a threshold value A, by carrying out current restriction control to lower a maximum current, increase in temperature of secondary battery 104 can be suppressed at time T(2) or later in FIG. 4.

For example, in continuous charging and discharging in battery system 2 in which the plurality of secondary batteries 102 and 104 are connected in parallel as described above, current restriction control based on the difference between the first integrated value and the second integrated value cannot appropriately be carried out but the temperature of at least one of secondary batteries that constitute battery assembly 100 may increase to such an extent as accelerating deterioration. Continuous charging and discharging refers, for example, to a charging and discharging state in which long discharging (for example, discharging for two hundred seconds or longer) as in continued high-speed travel on a highway and long charging (for example, charging for two hundred seconds or longer) as in plug-in charging are alternately repeated.

In continuous charging and discharging, during a period from the time point of start of charging and discharging until lapse of a certain time period, the current is temporarily concentrated to the low-resistance battery, however, a current difference between secondary batteries 102 and 104 may thereafter be eliminated. Consequently, a state that the temperature of the high-resistance battery is higher than the temperature of the low-resistance battery continues and the temperature difference increases. Consequently, deterioration of the high-resistance battery may be accelerated.

Figure 5:
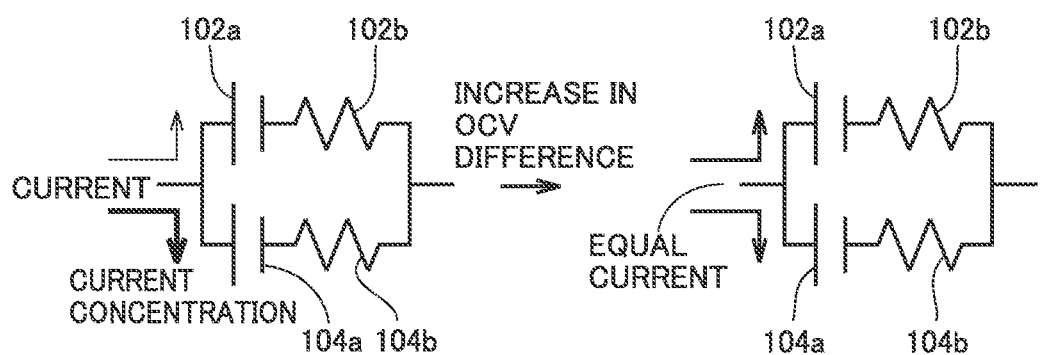
FIG. 5 is a diagram showing an exemplary equivalent circuit of a plurality of secondary batteries that constitute the battery assembly.

FIG. 5 is a diagram showing an exemplary equivalent circuit of the plurality of secondary batteries 102 and 104 that constitute battery assembly 100. As shown in FIG. 5, secondary battery 102 includes a voltage source 102a and an internal resistance 102b. Secondary battery 104 includes a voltage source 104a and an internal resistance 104b. Voltage source 102a and voltage source 104a provides identical voltages. Internal resistance 102b is larger in resistance value than internal resistance 104b.

For example, in continuous charging in battery assembly 100 thus configured, immediately after start of charging, the current flows through the low-resistance battery in a temporarily concentrated manner. In continuous charging, the $OCV_2$ of the low-resistance battery becomes higher than the $OCV_1$ of the high-resistance battery, and $\Delta OCV$ increases. With increase in $\Delta OCV$, concentration of the current to the low-resistance battery is mitigated and the current difference between the low-resistance battery and the high-resistance battery is eliminated.

Figure 6:
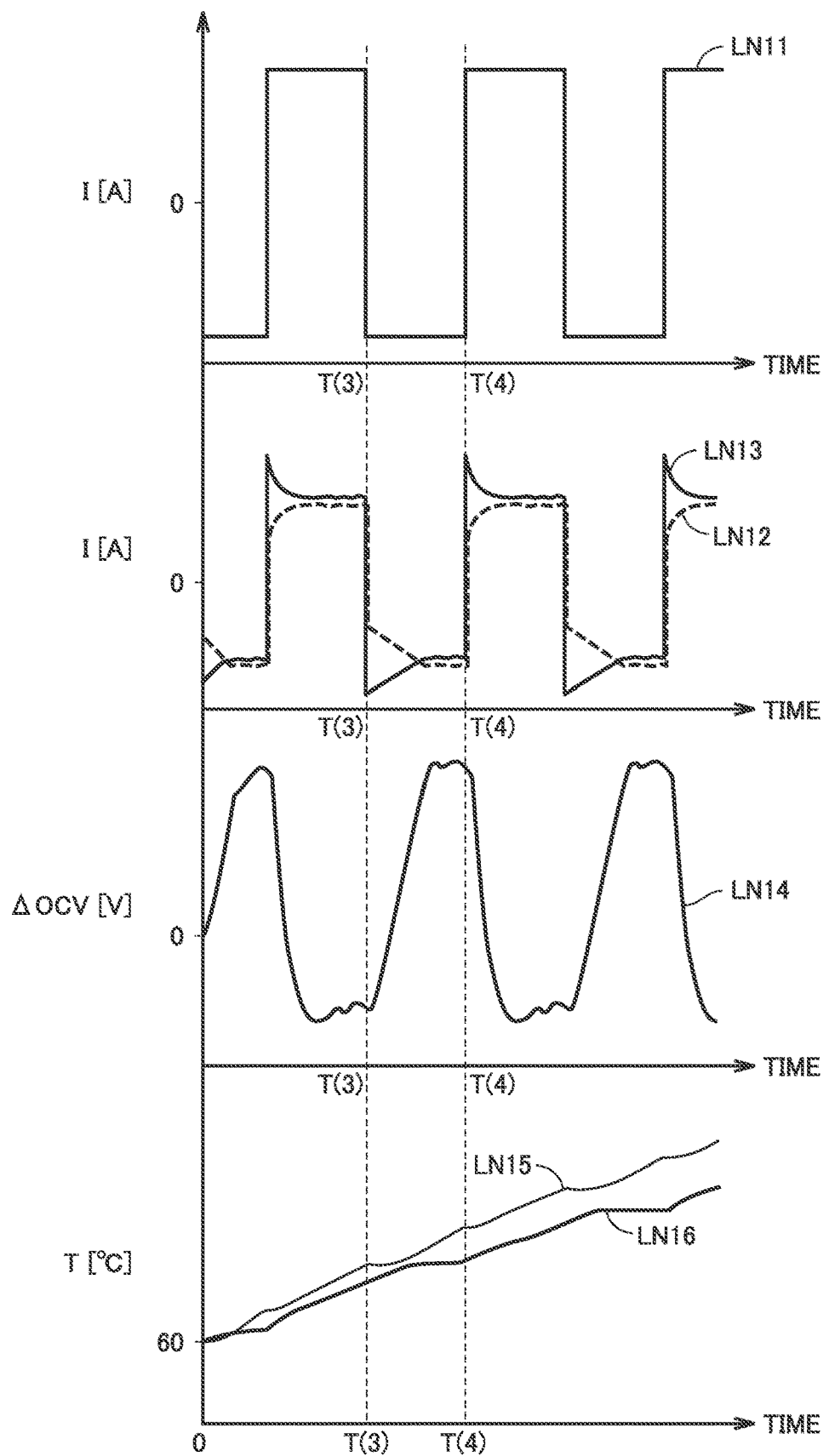
FIG. 6 is a timing chart showing exemplary change in current, ΔOCV, and a battery temperature in continuous charging and discharging.

FIG. 6 is a timing chart showing exemplary change in current, $\Delta OCV$, and a battery temperature in continuous charging and discharging.

LN11 in FIG. 6 shows change in current that flows through battery assembly 100. LN12 (a dashed line) in FIG. 6 shows change in current that flows through secondary battery 102 (high-resistance battery). LN13 (a solid line) in FIG. 6 shows change in current that flows through secondary battery 104 (low-resistance battery). LN14 in FIG. 6 shows change in $\Delta OCV$. LN15 (a thin line) in FIG. 6 shows change in temperature of secondary battery 102 (high-resistance battery). LN16 (a bold line) in FIG. 6 shows change in temperature of secondary battery 104 (low-resistance battery). An initial value of the temperature of each of secondary batteries 102 and 104 is assumed, for example, as 60° C.

As shown with LN11 in FIG. 6, an example in which continuous charging and discharging to and from battery assembly 100 is carried out is assumed. As shown with LN12 and LN13 in FIG. 6, during a period from the time point of start of charging (for example, time T(3)) until the time point of lapse of a certain time period (for example, time T(4)), the current that flows through the low-resistance battery is larger in magnitude than the current that flows through the high-resistance battery, and $\Delta OCV$ increases. At this time, magnitude of the current that flows through the low-resistance battery becomes smaller with lapse of time, and magnitude of the current that flows through the high-resistance battery increases with lapse of time. Then, at the time point of lapse of the certain time period since the time point of start of charging, the current that flows through the low-resistance battery is substantially equal to the current that flows through the high-resistance battery. As the current difference between the low-resistance battery and the high-resistance battery is eliminated, an amount of heat generation in the high-resistance battery becomes larger than an amount of heat generation in the low-resistance battery by an amount corresponding to a higher internal resistance. Therefore, during a period from the time point of lapse of the certain time period until the time point of next switching to discharging (for example, time T(4)), an amount of increase in temperature (LN15 in FIG. 6) of the high-resistance battery is larger than an amount of increase in temperature (LN16 in FIG. 6) of the low-resistance battery.

During a period from the time point of start of discharging until the time point of lapse of the certain time period, the current that flows through the low-resistance battery is larger in magnitude than the current that flows through the high-resistance battery, and $\Delta OCV$ lowers. At this time, magnitude of the current that flows through the low-resistance battery becomes smaller with lapse of time, and magnitude of the current that flows through the high-resistance battery increases with lapse of time. Then, as the current difference between the low-resistance battery and the high-resistance battery is eliminated at the time point of lapse of the certain time period since the time point of start of discharging, the amount of heat generation in the high-resistance battery becomes larger than the amount of heat generation in the low-resistance battery. Therefore, during a period from the time point of lapse of the certain time period until the time point of next switching to charging, the amount of increase in temperature of the high-resistance battery becomes larger than the amount of increase in temperature of the low-resistance battery.

When the current is restricted based on a difference between the first integrated value and the second integrated value as in repeated short-period charging and discharging, the current may not appropriately be restricted.

Figure 7:
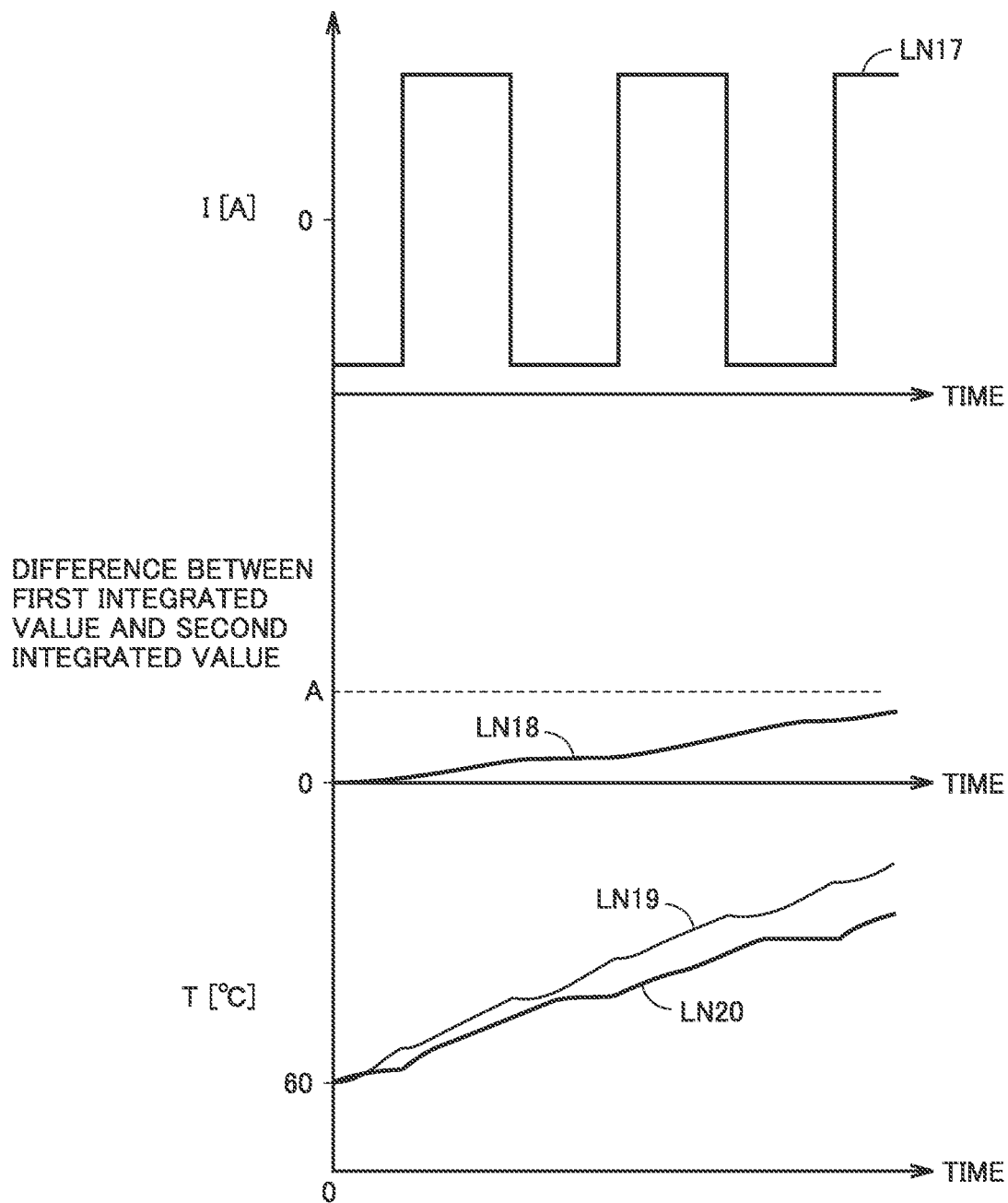
FIG. 7 is a diagram for illustrating change in difference between a first integrated value and a second integrated value in continuous charging and discharging.

FIG. 7 is a diagram for illustrating change in difference between the first integrated value and the second integrated value in continuous charging and discharging. LN17 in FIG. 7 shows change in current that flows through battery assembly 100 and corresponds to change in current shown with LN11 in FIG. 6. LN18 in FIG. 7 shows change in magnitude of a difference between the first integrated value and the second integrated value. LN19 (a thin line) in FIG. 7 shows change in temperature of the high-resistance battery and corresponds to change in temperature shown with LN15 in FIG. 6. LN20 in FIG. 7 shows change in temperature of the low-resistance battery and corresponds to change in temperature shown with LN16 in FIG. 6.

As shown with LN17 in FIG. 7, in continuous charging and discharging to and from battery assembly 100, a state without a current difference continues. Then, a state that the temperature (LN19 in FIG. 7) of the high-resistance battery is higher than the temperature (LN20 in FIG. 7) of the low-resistance battery continues and the temperature difference increases.

Magnitude of the difference between the first integrated value and the second integrated value, however, increases with increase in temperature difference as shown with LN18 in FIG. 7. As the current difference is eliminated, however, a state that the integrated value is smaller than threshold value A described above continues.

Consequently, current restriction control is not carried out and hence increase in temperature of the high-resistance battery continues. Consequently, deterioration of the high-resistance battery may be accelerated.

In the present embodiment, ECU 300 obtains an index value based on the difference (ΔOCV) between the maximum value and the minimum value of OCVs of the plurality of secondary batteries, and when the obtained index value is large, the currents that flow through the plurality of secondary batteries are restricted as compared with when the index value is small. More specifically, ECU 300 obtains as the index value, an average value calculated based on records of ΔOCVs. When the index value is larger than the threshold value, ECU 300 controls the maximum value of magnitude of the currents that flow through the plurality of secondary batteries to be smaller than when the index value is smaller than the threshold value.

Thus, as ΔOCV is larger, the current difference between the plurality of secondary batteries is eliminated. Therefore, when the index value obtained based on ΔOCV is large, the currents that flow through the plurality of secondary batteries are restricted as compared with when the index value is small. Thus, heat generation by the high-resistance battery among the plurality of secondary batteries which results in a temperature of the battery at which deterioration of the battery is accelerated can be suppressed.

Figure 8:
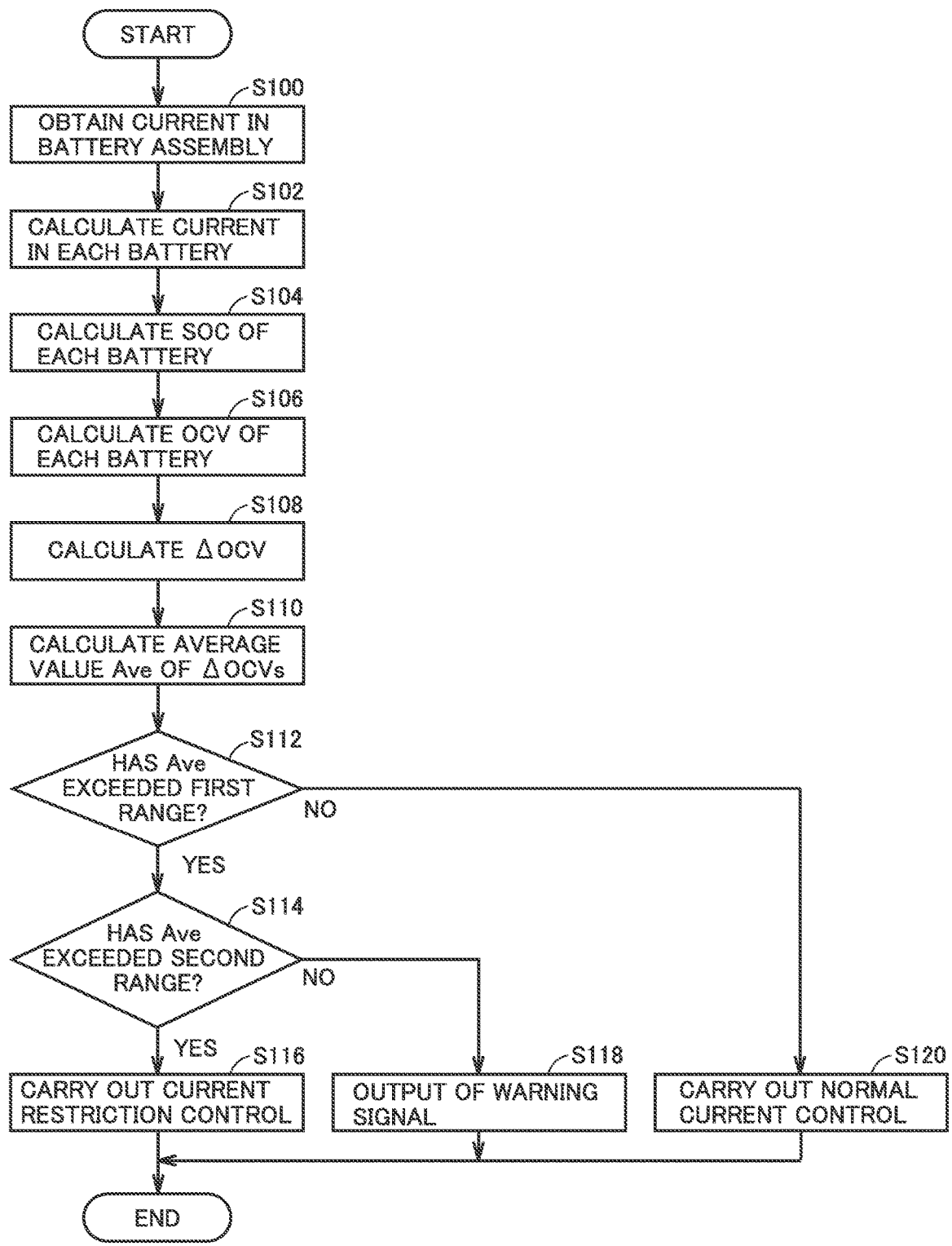
FIG. 8 is a flowchart showing exemplary processing performed by an ECU.

Processing performed by ECU 300 will be described below with reference to FIG. 8. FIG. 8 is a flowchart showing exemplary processing performed by ECU 300. Processing shown in this flowchart is repeatedly performed by ECU 300 shown in FIG. 1 every prescribed control period.

In step (which is denoted as S below) 100, ECU 300 obtains a current in battery assembly 100. ECU 300 obtains current Ib that flows through battery assembly 100, for example, with current sensor 220.

In S102, ECU 300 calculates a current in each battery. ECU 300 calculates currents $I_1$ and $I_2$ that flow through respective secondary batteries 102 and 104, for example, based on an expression (1) and an expression (2) below.

$$I_1[k] = \frac{R_2 \cdot I[k] + (OCV_1[k-1] - OCV_2[k-1])}{R_1 + R_2} \quad (1)$$

$$I_2[k] = \frac{R_1 \cdot I[k] + (OCV_1[k-1] - OCV_2[k-1])}{R_1 + R_2} \quad (2)$$

"k" in the expression (1) and the expression (2) represents a calculation step. Initial values (that is, $OCV_1[0]$ and $OCV_2[0]$) of the "$OCV_1$" and the "$OCV_2$" represent voltages in an unloaded state. "$R_1$" and "$R_2$" represent internal resistances of secondary batteries 102 and 104 obtained in advance, respectively. "$R_1$" and "$R_2$" may be measured, for example, in a stage of manufacturing of secondary batteries 102 and 104 or in assembly of battery assembly 100 (which includes assembly as a recycled battery and is denoted as a manufacturing stage etc. below). Alternatively, the $OCV_1[0]$ and the $OCV_2[0]$ may be measured, for example, in the manufacturing stage etc. of secondary batteries 102 and 104, or may be detected by voltage sensor 210 when SMR 50 is opened or when charging and discharging to and from battery assembly 100 is not carried out.

In S104, ECU 300 calculates the SOC of each battery. ECU 300 calculates an $SOC_1$ of secondary battery 102 and an $SOC_2$ of secondary battery 104, for example, based on an expression (3) and an expression (4) below.

$$SOC_1[k] = SOC_1[k-1] - \frac{I_1[k] \cdot \Delta t \cdot 100}{Cap_1 \cdot 3600} \quad (3)$$

$$SOC_2[k] = SOC_2[k-1] - \frac{I_1[k] \cdot \Delta t \cdot 100}{Cap_1 \cdot 3600} \quad (4)$$

"k" in the expression (3) and the expression (4) represents a calculation step. "Δt" represents a control period. Initial values (that is, $SOC_1[0]$ and $SOC_2[0]$) of the $SOC_1$ and the $SOC_2$ are calculated, for example, based on the $OCV_1[0]$ and the $OCV_2[0]$ and a table showing relation between the OCV and the SOC. The table showing relation between the OCV and the SOC is adapted, for example, through experiments or the like in advance and stored in advance in memory 302 of ECU 300.

"Cap1" and "Cap2" represent battery capacities of secondary batteries 102 and 104, respectively. For example, a predetermined value corresponding to a full charge capacity is set as each of initial values of battery capacities Cap1 and Cap2. The initial values of battery capacities Cap1 and Cap2 may be measured, for example, in the manufacturing stage etc. of secondary batteries 102 and 104. In long-term charging (for example, plug-in charging) to battery assembly 100, ECU 300 calculates SOCs before and after charging based on voltages before and after charging, and calculates a difference ΔSOC between the calculated SOCs. Then, an amount of electric power corresponding to a full charge state (the SOC being 100%) is calculated as the battery capacity based on an amount of charging corresponding to the calculated ΔSOC.

In S106, ECU 300 calculates the OCV of each battery. ECU 300 calculates the $OCV_1$ of secondary battery 102 and the $OCV_2$ of secondary battery 104 based on the calculated SOC of each battery. ECU 300 calculates the $OCV_1$ of secondary battery 102 and the $OCV_2$ of secondary battery 104, for example, based on the calculated $SOC_1$ and $SOC_2$ of the batteries and the table showing relation between the OCV and the SOC.

In S108, ECU 300 calculates ΔOCV. ECU 300 calculates ΔOCV by subtracting the $OCV_1$ from the $OCV_2$.

In S110, ECU 300 calculates an average value Ave of ΔOCVs. ECU 300 calculates average value Ave based on records of ΔOCVs. ECU 300 calculates average value Ave, for example, by exponentially smoothed moving average (EMA) based on the calculated ΔOCV and records of ΔOCVs during an immediately preceding predetermined period. In exponentially smoothed moving average, a weight coefficient set for each of records of ΔOCVs is decreased more exponentially for an older record. A degree of decrease in weight is set, for example, as a smoothing coefficient α. Smoothing coefficient α is set to a value between 0 and 1. Exponentially smoothed moving average is calculated, for example, based on an expression Ave[k]=Ave[k−1]+α (ΔOCV[k]−Ave[k−1]). Since a method of calculating average value Ave by exponentially smoothed moving average or a method of setting smoothing coefficient α has been known, detailed description thereof will not be provided.

In S112, ECU 300 determines whether or not calculated average value Ave has exceeded a first range. The first range refers to values for determining whether or not a warning to a user is to be issued, and includes a range from an upper limit value Ave(0) to a lower limit value Ave(2). The first range is adapted, for example, through experiments or the like. For example, when calculated average value Ave exceeds upper limit value Ave(0) or is smaller than lower limit value Ave(2), ECU 300 determines that the average value has exceeded the first range. When calculated average value Ave is determined as exceeding the first range (YES in S112), the process proceeds to S114.

In S114, ECU 300 determines whether or not calculated average value Ave has exceeded a second range. The second range refers to values for carrying out current restriction control and includes a range from an upper limit value Ave(1) (>Ave(0)) to a lower limit value Ave(3) Ave(2)). The second range is adapted, for example, through experiments or the like. For example, when calculated average value Ave exceeds upper limit value Ave(1) or is smaller than lower limit value Ave(3), ECU 300 determines that the average value has exceeded the second range. When calculated average value Ave is determined as exceeding the second range (YES in S114), the process proceeds to S116.

In S116, ECU 300 carries out current restriction control. ECU 300 sets, for example, a maximum current Imax representing a maximum value of magnitude of the current, and controls PCU 40 such that set maximum current Imax is not exceeded. ECU 300 calculates maximum current Imax by multiplying an allowable current Ia set based on a state of battery assembly 100 by a correction coefficient C set based on the state of battery assembly 100 including $\Delta$OCV.

ECU 300 sets allowable current Ia, for example, based on a temperature of battery assembly 100 and the SOC of battery assembly 100. ECU 300 calculates allowable current Ia based on the temperature of battery assembly 100 and the SOC of battery assembly 100, for example, by using a table or a map or a mathematical expression representing relation among the temperature, the SOC, and the allowable current. The table or the map or the mathematic expression as described above is stored in advance, for example, in memory 302 of ECU 300. Relation among the temperature, the SOC, and the allowable current includes, for example, such relation that, as the temperature is closer to a room temperature (for example, from 15° C. to 25° C.), allowable current Ia is higher, and as the temperature is distant from the room temperature, allowable current Ia is lower. Furthermore, relation among the temperature, the SOC, and the allowable current includes, for example, such relation that, as the SOC is closer to a control center, allowable current Ia is higher, and as the SOC is distant from the control center, allowable current Ia is lower.

ECU 300 may set, for example, any one of temperature Tb1 of secondary battery 102 and temperature Tb2 of secondary battery 104 as the temperature of battery assembly 100 or an average value of temperature Tb1 and temperature Tb2 as the temperature of battery assembly 100. Furthermore, ECU 300 may set, for example, any one of the $SOC_1$ of secondary battery 102 and the $SOC_2$ of secondary battery 104 as the SOC of battery assembly 100 or set the average value of the $SOC_1$ and the $SOC_2$ as the SOC of battery assembly 100.

Furthermore, ECU 300 sets correction coefficient C based on $\Delta$OCV, the temperature of battery assembly 100, and the SOC of battery assembly 100. Correction coefficient C is set to a value larger than 0 and smaller than 1. ECU 300 sets correction coefficient C based on $\Delta$OCV, the temperature of battery assembly 100, and the SOC of battery assembly 100, for example, by using a table or a map or a mathematical expression representing relation among $\Delta$OCV, the temperature, the SOC, and correction coefficient C. The table or the map or the mathematic expression as described above is stored in advance, for example, in memory 302 of ECU 300. Relation among $\Delta$OCV, the temperature, the SOC, and the correction coefficient includes, for example, such relation that, as magnitude of $\Delta$OCV increases, the correction coefficient is smaller, and as magnitude of $\Delta$OCV decreases, the correction coefficient increases. Furthermore, relation among $\Delta$OCV, the temperature, the SOC, and the correction coefficient includes, for example, such relation that, as the temperature is closer to the room temperature, the correction coefficient increases, and as the temperature is distant from the room temperature, the correction coefficient decreases. Furthermore, relation among $\Delta$OCV, the temperature, the SOC, and the correction coefficient includes, for example, such relation that, as the SOC is closer to the control center, correction coefficient C increases, and as the SOC is distant from the control center, correction coefficient C decreases.

ECU 300 sets, for example, a lowest temperature of the plurality of secondary batteries 102 and 104 as the temperature of battery assembly 100. In charging of battery assembly 100, ECU 300 sets the maximum SOC of the plurality of secondary batteries 102 and 104 as the SOC of battery assembly 100. In discharging of battery assembly 100, ECU 300 sets the lowest SOC of the plurality of secondary batteries 102 and 104 as the SOC of battery assembly 100.

When average value Ave is determined as not exceeding the second range (NO in S114), the process makes transition to S118.

In S118, ECU 300 provides a warning signal to display 260. The warning signal includes, for example, a control signal for showing on display 260, information indicating that battery system 2 is abnormal. When average value Ave is determined as not exceeding the first range (NO in S112), the process makes transition to S120.

In S120, ECU 300 carries out normal current control. Specifically, ECU 300 sets a predetermined value as the maximum current, and controls PCU 40 such that the set maximum current is not exceeded. The maximum current in normal current control is, for example, higher than the maximum current that can be set in current restriction control. Furthermore, in normal current control, for example, a predetermined upper limit value is set for an amount of change per predetermined time.

An operation by ECU 300 included in battery system 2 according to the present embodiment, based on the structure and the flowchart as above, will be described with reference to FIGS. 9, 10, and 11.

An example in which continuous charging is carried out in battery assembly 100 is assumed. In this case, a current that flows through battery assembly 100 is obtained (S100) and currents $I_1$ and $I_2$ in respective batteries (secondary batteries 102 and 104) are calculated based on the obtained current in battery assembly 100 (S102). The $SOC_1$ and the $SOC_2$ of the batteries are calculated based on the calculated current in each battery (S104). Then, the $OCV_1$ and the $OCV_2$ of the batteries are calculated based on the calculated $SOC_1$ and $SOC_2$ of the batteries (S106).

Figure 9:
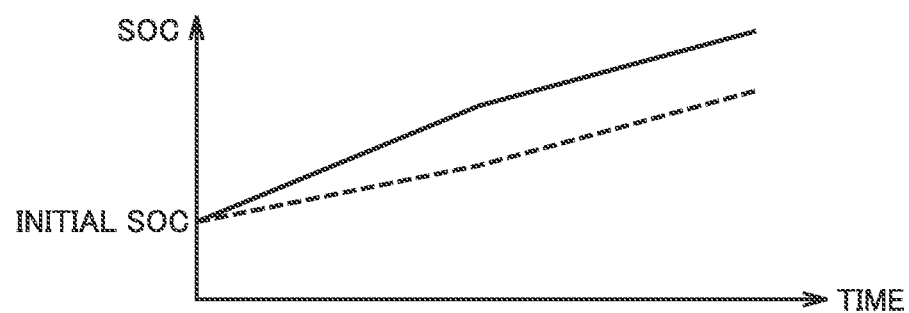
FIG. 9 is a diagram for illustrating exemplary change in SOC of each battery in continuous charging of the battery assembly in an unloaded state.

FIG. 9 is a diagram for illustrating exemplary change in SOC of each battery in continuous charging of battery assembly 100 in the unloaded state. The abscissa in FIG. 9 represents time. The ordinate in FIG. 9 represents the SOC. A dashed line in FIG. 9 shows change in SOC of secondary battery 102 which is the high-resistance battery. A solid line in FIG. 9 shows change in SOC of secondary battery 104 which is the low-resistance battery.

Figure 10:
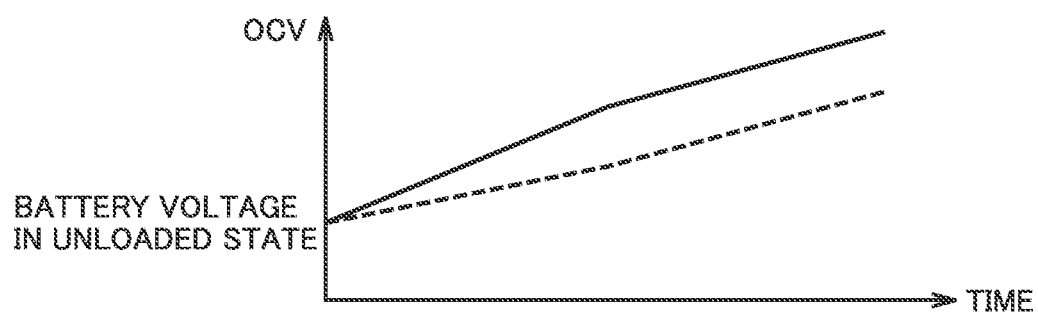
FIG. 10 is a diagram for illustrating exemplary change in OCV of each battery in continuous charging of the battery assembly in the unloaded state.

FIG. 10 is a diagram for illustrating exemplary change in OCV of each battery in continuous charging of battery assembly 100 in the unloaded state. The abscissa in FIG. 10 represents time. The ordinate in FIG. 10 represents the OCV. A dashed line in FIG. 10 shows change in OCV of secondary battery 102 which is the high-resistance battery. A solid line in FIG. 10 shows change in OCV of secondary battery 104 which is the low-resistance battery.

When continuous charging is started, as shown in FIG. 9, during a certain time period after start of charging, the current is concentrated to the low-resistance battery. Therefore, an amount of increase per unit time (an inclination of the solid line in FIG. 9) of the $SOC_2$ of the low-resistance battery is larger than an amount of increase per unit time (an inclination of the dashed line in FIG. 9) of the $SOC_1$ of the high-resistance battery. Therefore, as shown in FIG. 10, during the certain time period after start of charging, an amount of increase per unit time (an inclination of the solid line in FIG. 10) of the $OCV_2$ of the low-resistance battery is larger than an amount of increase per unit time (an inclination of the dashed line in FIG. 10) of the $OCV_1$ of the high-resistance battery.

Then, after lapse of the certain time period since start of charging, the current difference between the low-resistance battery and the high-resistance battery is eliminated. Therefore, as shown in FIGS. 9 and 10, the amount of increase per unit time of the SOC and the amount of increase per unit time of the OCV are substantially equal between the low-resistance battery and the high-resistance battery.

In continuous discharging, in contrast to charging, the $SOC_1$, the $SOC_2$, the $OCV_1$, and the $OCV_2$ change to decrease, and during a certain time period after start of discharging, an amount of decrease per unit time of the $SOC_2$ of the low-resistance battery is larger than an amount of decrease per unit time of the $SOC_1$ of the high-resistance battery. Therefore, during the certain time period after start of discharging, the amount of decrease per unit time of the $OCV_2$ of the low-resistance battery is larger than an amount of decrease per unit time of the $OCV_1$ of the high-resistance battery. After lapse of the certain time period since start of discharging, the current difference between the low-resistance battery and the high-resistance battery is eliminated. Therefore, the amount of decrease per unit time of the SOC and the amount of decrease per unit time of the OCV are substantially equal between the low-resistance battery and the high-resistance battery.

When the $OCV_1$ and the $OCV_2$ of secondary batteries 102 and 104 are calculated, ΔOCV is calculated by subtracting the $OCV_1$ from the $OCV_2$ (S108). Average value Ave is calculated based on records of calculated ΔOCVs (S110).

Figure 11:
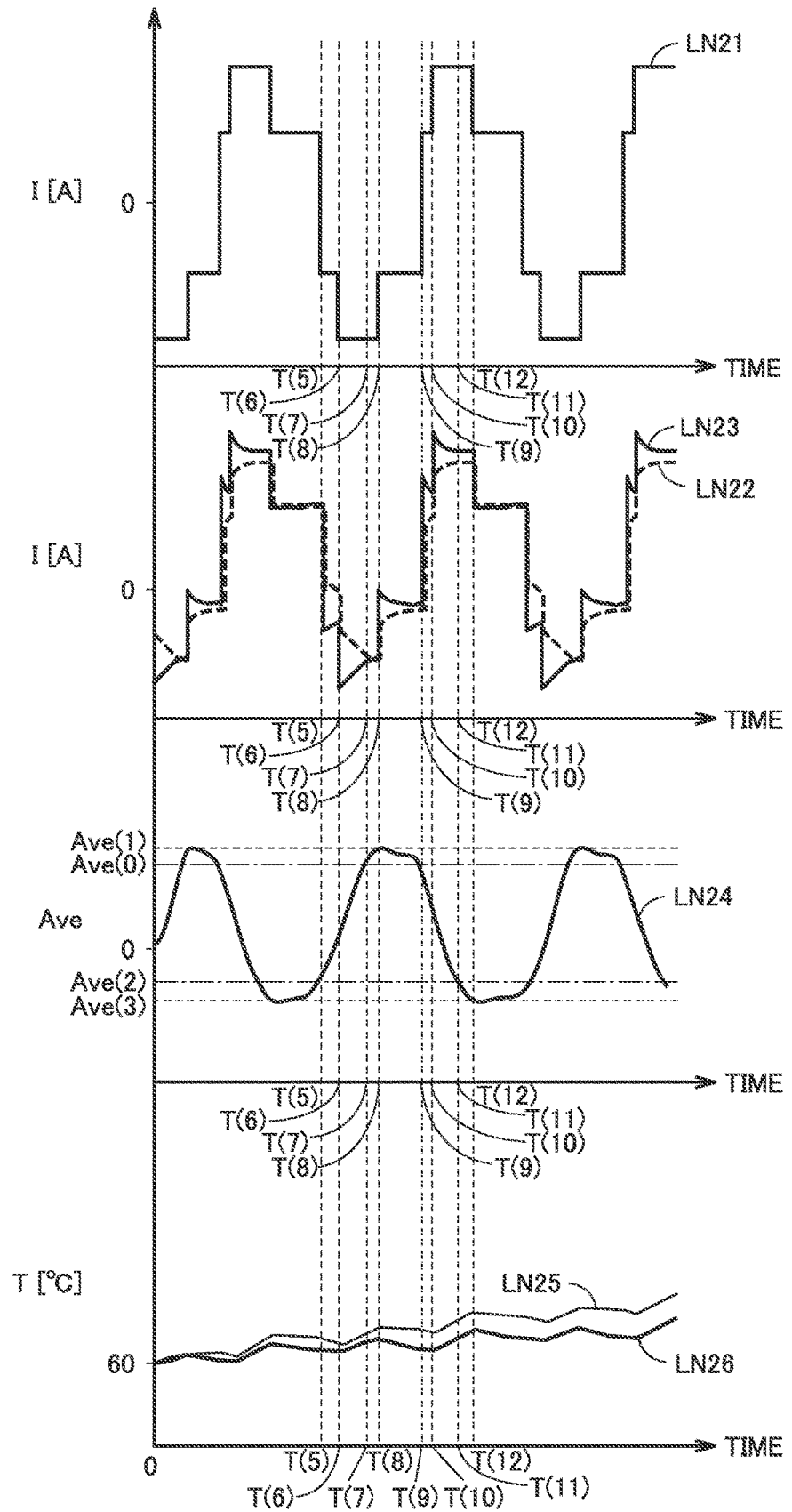
FIG. 11 is a timing chart for illustrating an operation by the ECU.

FIG. 11 is a timing chart for illustrating an operation by ECU 300. LN21 in FIG. 11 shows change in current that flows through battery assembly 100. LN22 (a dashed line) in FIG. 11 shows change in current that flows through secondary battery 102 (high-resistance battery). LN23 (a solid line) in FIG. 11 shows change in current that flows through secondary battery 104 (the low-resistance battery). LN24 in FIG. 11 shows change in ΔOCV. LN25 (a thin line) in FIG. 11 shows change in temperature of secondary battery 102 (the high-resistance battery). LN26 (a bold line) in FIG. 11 shows change in temperature of secondary battery 104 (low-resistance battery).

As shown with LN21 in FIG. 11, an example in which continuous charging and discharging to and from battery assembly 100 is carried out is assumed. As shown with LN22 and LN23 in FIG. 11, for example, when charging is started at time T(5), a charging current increases in two steps between time T(5) and time T(6) because the upper limit value is set for the amount of change per predetermined time in normal current control. During a period until lapse of a certain time period since time T(6), magnitude of the current that flows through the low-resistance battery is larger than magnitude of the current that flows through the high-resistance battery, and ΔOCV increases. Magnitude of the current that flows through the low-resistance battery decreases with lapse of time, and magnitude of the current that flows through the high-resistance battery increases with lapse of time. Then, at the time point of lapse of the certain time period since time T(6), the current that flows through the low-resistance battery is substantially equal to the current that flows through the high-resistance battery. The current difference between the low-resistance battery and the high-resistance battery is thus eliminated, whereas ΔOCV increases as shown with LN24 in FIG. 11. When average value Ave becomes larger than threshold value Ave(0) at time T(7) as shown with LN24 in FIG. 11 (YES in S112) and is equal to or smaller than threshold value Ave(1) (NO in S114), a warning signal is provided (S118), and a warning to the effect that battery system 2 is abnormal is issued to a user. When average value Ave of ΔOCV exceeds threshold value Ave(1) at time T(8) (YES in S114), current restriction control is carried out (S116). As current restriction control is carried out, the maximum current is restricted as shown with LN21 in FIG. 11, and increase in temperature of the high-resistance battery is suppressed as shown with LN25 and LN26 in FIG. 11. Therefore, increase in temperature difference between the high-resistance battery and the low-resistance battery is suppressed.

As shown with LN22 and LN23 in FIG. 11, for example, when discharging is started at time T(9), ΔOCV is within the first range (NO in S112), and hence normal current control is carried out (S120) and the upper limit value is set for the amount of change per predetermined time. Therefore, a discharging current increases in two steps between time T(9) and time T(10). During a period until lapse of a certain time period since time T(10), magnitude of the current that flows through the low-resistance battery is larger than magnitude of the current that flows through the high-resistance battery, and ΔOCV lowers. Magnitude of the current that flows through the low-resistance battery decreases with lapse of time, and magnitude of the current that flows through the high-resistance battery increases with lapse of time. At the time point of lapse of the certain time period since time T(10), the current that flows through the low-resistance battery becomes substantially equal to the current that flows through the high-resistance battery. The current difference between the low-resistance battery and the high-resistance battery is thus eliminated, whereas ΔOCV is lowered as shown with LN24 in FIG. 11. When average value Ave becomes smaller than threshold value Ave(2) at time T(11) as shown with LN24 in FIG. 11 (YES in S112) and is equal to or larger than threshold value Ave(3) (NO in S114), a warning signal is provided (S118), and a warning to the effect that battery system 2 is abnormal is issued to a user. When average value Ave of ΔOCV becomes smaller than threshold value Ave(3) at time T(12) (YES in S114), current restriction control is carried out (S116). As current restriction control is carried out, the maximum current is restricted at time T(12) as shown with LN21 in FIG. 11, and increase in temperature of the high-resistance battery is suppressed as shown with LN25 and LN26 in FIG. 11. Therefore, increase in temperature difference between the high-resistance battery and the low-resistance battery is suppressed.

In such continuous charging and discharging as repeating high-speed travel and plug-in charging in an electric vehicle incorporating battery system 2 according to the present embodiment as above, with increase in ΔOCV, the current difference between the plurality of secondary batteries may be eliminated, the temperature of the high-resistance battery may increase, and the temperature difference between the high-resistance battery and the low-resistance battery may increase. Therefore, when average value Ave which is an index value obtained based on ΔOCV is large, current restriction control is carried out to restrict the currents that flow through the plurality of secondary batteries as compared with when average value Ave is small. Therefore, heat generation by the high-resistance battery among the plurality of secondary batteries which results in a temperature of the battery at which deterioration of the battery is accelerated can be suppressed. Therefore, a battery system capable of suppressing deterioration of the plurality of secondary batteries connected in parallel can be provided.

The OCV of each of the plurality of secondary batteries can highly accurately be calculated by using the expressions (1) to (4). Therefore, the currents that flow through the plurality of secondary batteries can appropriately be restricted based on average value Ave of ΔOCVs which is the index value obtained based on the OCV of each of the plurality of secondary batteries. Therefore, heat generation by a battery relatively high in internal resistance among the plurality of secondary batteries which results in a temperature of the battery at which deterioration of the battery is accelerated can be suppressed.

Since maximum current Imax of currents that flow through the plurality of secondary batteries can appropriately be set based on allowable current Ia and correction coefficient C, heat generation by a battery relatively high in internal resistance among the plurality of secondary batteries which results in a temperature of the battery at which deterioration of the battery is accelerated can be suppressed.

When average value Ave which is the index value exceeds the first range, information indicating that battery system 2 is abnormal is given by means of display 260. Therefore, the user can recognize that battery system 2 is abnormal.

A modification will be described below.

Though an electric vehicle is described as vehicle 1 by way of example in the present embodiment, a vehicle incorporating a battery assembly in which batteries are connected in parallel should only be provided, and limitation to the electric vehicle is not particularly intended. For example, a hybrid vehicle incorporating a motor generator for driving and an engine as a motive power source may be applicable.

Though an example in which current restriction control is carried out when average value Ave of ΔOCVs exceeds the second range is described in the present embodiment, for example, whether or not continuous charging and discharging is being carried out may be determined, and current restriction control may be carried out when continuous charging and discharging is being carried out and average value Ave of ΔOCVs exceeds the second range. Furthermore, in repeated short-period charging and discharging, current restriction control may be carried out when the difference between the first integrated value and the second integrated value is equal to or larger than the threshold value.

Though the average value calculated as the index value by exponentially smoothed moving average based on records of ΔOCVs is described in the present embodiment, limitation thereto is not particularly intended. For example, an average value may be calculated as an index, by simple moving average or weighted moving average based on records of ΔOCVs.

Though an example in which battery assembly 100 includes secondary batteries 102 and 104 is described by way of example in the present embodiment, the number of secondary batteries connected in parallel is not particularly limited to two but may be set to three or more. In this case, ΔOCV is calculated based on the maximum value and the minimum value of OCVs of secondary batteries connected in parallel. The number of battery blocks connected in parallel is not particularly limited to one but may be set to two or more. In this case, ΔOCV is calculated for each battery block, and when ΔOCV of any battery block exceeds the second range, current restriction control is carried out.

Figure 12:
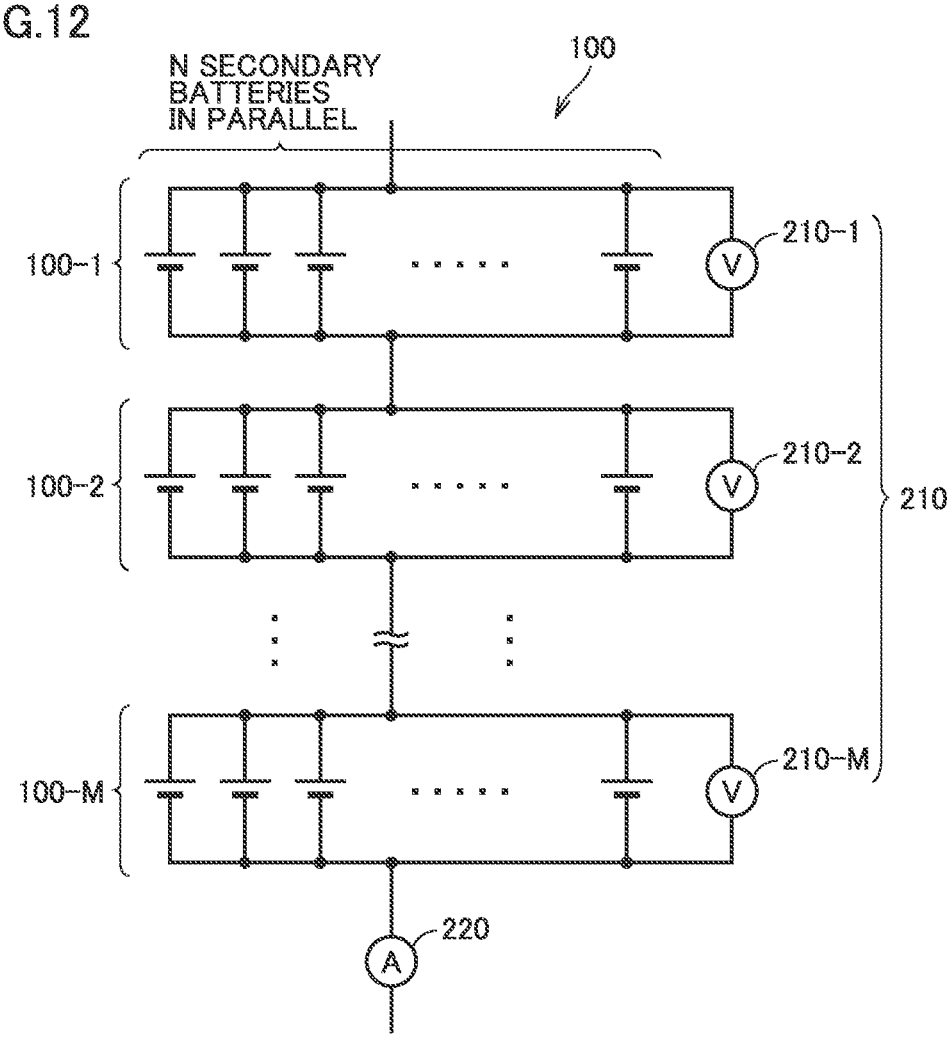
FIG. 12 is a diagram showing an exemplary configuration of the battery assembly in a modification.

FIG. 12 is a diagram showing an exemplary configuration of battery assembly 100 in a modification. As shown in FIG. 12, battery assembly 100 may be configured with M battery blocks 100-1 connected in series, each of the battery blocks being configured with N secondary batteries connected in parallel. In this case, voltages of battery blocks 100-1 to 100-M are detected by respective voltage sensors 210-1 to 210-M, and results of detection are transmitted to ECU 300.

According to such a configuration, ECU 300 calculates the OCV of each of secondary batteries that constitute battery assembly 100. ECU 300 calculates ΔOCV based on the maximum value and the minimum value of OCVs of the plurality of secondary batteries included in any battery block. Thus, ECU 300 calculates ΔOCV of each of battery blocks 100-1 to 100-M.

ECU 300 provides a warning signal when at least any of a plurality of ΔOCVs calculated in battery blocks 100-1 to 100-M exceeds the first range. ECU 300 carries out current restriction control when at least any one of the plurality of ΔOCVs calculated in battery blocks 100-1 to 100-M exceeds the second range. By doing so as well, heat generation by the high-resistance battery among the plurality of secondary batteries which results in a temperature of the battery at which deterioration of the battery is accelerated can be suppressed.

The entirety or a part of the modification may be carried out as being combined as appropriate.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery system comprising:
a plurality of secondary batteries connected in parallel to each other; and
a controller that controls currents that flow through the plurality of secondary batteries based on an open circuit voltage of each of the plurality of secondary batteries, wherein
the controller
calculates a difference between a maximum value and a minimum value of open circuit voltages of the plurality of secondary batteries,
in continuous charging and discharging, carries out current restriction control that restricts, when an index value obtained based on the calculated difference is larger than a first threshold value, the currents that flow through the plurality of secondary batteries as compared with when the index value is smaller than the first threshold value, and
in repeated short-period charging and discharging, carries out the current restriction control when a difference between a first integrated value and a second integrated value is equal to or larger than a second threshold value,
the first integrated value is an integrated value of a difference between an amount of heat generation and an amount of heat radiation in a first battery of the plurality of secondary batteries, and the second integrated value is an integrated value of a difference between an amount of heat generation and an amount of heat radiation in a second battery of the plurality of secondary batteries.

2. The battery system according to claim 1, wherein the controller obtains as the index value, an average value calculated based on records of the difference.

3. The battery system according to claim 1, wherein the controller controls a maximum value of magnitude of the currents that flow through the plurality of secondary batteries when the index value is larger than the first threshold value, to be smaller than when the index value is smaller than the threshold value.

4. The battery system according to claim 1, further comprising:
 a voltage detector that detects voltages of the plurality of secondary batteries; and
 a current detector that detects the currents that flow through the plurality of secondary batteries, wherein the controller
  obtains voltages in an unloaded state of the plurality of secondary batteries with the voltage detector,
  estimates an initial value of a charged state of each of the plurality of secondary batteries based on the obtained voltages,
  estimates the charged state of each of the plurality of secondary batteries based on the initial value of the charged state, the currents detected by the current detector, and a battery capacity of each of the plurality of secondary batteries, and
  calculates the open circuit voltage of each of the plurality of secondary batteries based on the estimated charged state of each of the plurality of secondary batteries.

5. The battery system according to claim 1, further comprising a notification apparatus that gives predetermined information, wherein
 when the index value is larger than a third threshold value, the controller gives information indicating that the battery system is abnormal through the notification apparatus.

* * * * *